United States Patent
Fallica et al.

(10) Patent No.: US 6,551,944 B1
(45) Date of Patent: Apr. 22, 2003

(54) PROCESS FOR MANUFACTURING A SEMICONDUCTOR MATERIAL WAFER COMPRISING SINGLE-CRYSTAL REGIONS SEPARATED BY INSULATING MATERIAL REGIONS

(75) Inventors: Piero Giorgio Fallica, Catania (IT); Davide Giuseppe Patti, Catania (IT); Cirino Rapisarda, Belpasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/544,717

(22) Filed: Apr. 6, 2000

(30) Foreign Application Priority Data

Apr. 7, 1999 (EP) .......................................... 99830199

(51) Int. Cl.[7] .............................................. H01L 21/00
(52) U.S. Cl. ..................... 438/719; 148/33.2; 148/33.3; 216/2; 216/39; 216/79; 216/99; 438/734; 438/745; 438/753
(58) Field of Search ........................ 148/33, 33.2, 33.3; 257/506, 510; 216/2, 39, 79, 99; 438/359, 424, 427, 444, 719, 734, 745, 753

(56) References Cited

U.S. PATENT DOCUMENTS

| | | | |
|---|---|---|---|
| 5,212,109 A | 5/1993 | Mihara ........................ | 437/67 |
| 5,641,380 A | 6/1997 | Yamazaki et al. ........... | 438/304 |
| 6,075,269 A | * 6/2000 | Terasawa et al. ......... | 438/734 X |

FOREIGN PATENT DOCUMENTS

| | | |
|---|---|---|
| GB | 2 156 149 A | 10/1985 |
| JP | 03071651 | 3/1991 |
| JP | 08070112 | 3/1996 |
| WO | 0 059 796 A1 | 9/1982 |
| WO | 0 191 476 A2 | 8/1986 |
| WO | 0 223 694 A2 | 5/1987 |

OTHER PUBLICATIONS

S. Mukherjee, "Dieletric–Isolation based on high voltage IC process," Dieletric Isolation and Silicon–on–Insulator Technologies: pp. 70–76.
Y. Sugawara, "Power DI–Ics developed since 1981 and their applications," Dieletric Isolation Technologies and Power Ics: pp. 105–108.
y. Sugawara, "Increment techniques for electric power capibility," Dieletric Isolation Technologies and Power Ics: pp. 150–157.
Y. Sugawara, "Comparison Between Bulk and SOI Processing," SOI CMOS Technology: pp. 91–93.
Simni and Simon, "Wafer Bonding," SOI Materials: pp. 49–54.

* cited by examiner

*Primary Examiner*—William A. Powell
(74) *Attorney, Agent, or Firm*—Lisa K. Jorgenson; E. Russell Tarleton; Seed IP Law Group PLLC

(57) ABSTRACT

A process including the steps of: carrying out a directional etching in a semiconductor material body to form trenches having a first width; carrying out an isotropic etching of the semiconductor material body under the trenches to form cavities having a width larger than the trenches; covering the walls of the cavities with dielectric material; depositing non-conducting material different from thermal oxide to fill the cavities at least partially, so as to form a single-crystal island separated from the rest of the semiconductor material body. The isotropic etching permits the formation of at least two adjacent cavities separated by a support region of semiconductor material, which is oxidized together with the walls of the cavities to provide a support to the island prior to filling with non-conducting material.

30 Claims, 7 Drawing Sheets

PROCESS FOR MANUFACTURING A SEMICONDUCTOR MATERIAL WAFER COMPRISING SINGLE-CRYSTAL REGIONS SEPARATED BY INSULATING MATERIAL REGIONS

TECHNICAL FIELD

The present invention relates to a process for manufacturing a semiconductor material wafer comprising single-crystal regions separated by insulating material regions, in particular for manufacturing integrated power devices, and wafer thus obtained.

BACKGROUND OF THE INVENTION

As known, the integration of power devices with components of the control circuitry involves several problems mainly due to parasitic effects depending on undesired interactions between the power devices and the circuitry components. Conventionally, electrical isolation between various components produced on the same chip is obtained through reverse-biased PN junctions. Thereby parasitic components (such as diodes, transistors or capacitors) degrading the performance of the circuit also form besides the design components.

Parasitic elements are disadvantageously present in any type of integrated circuit, but are more problematic in power devices, and particularly the vertical current flow type. In fact, the problems caused by the parasitic components depends on the values of the operating currents and voltages and, in particular, the switching speed. Furthermore, with respect to lateral devices, the vertical current flow devices have a more complex structure, composed of many active layers, and it is therefore difficult to provide a physical/mathematical model taking parasitic effects into account.

Various solutions have been proposed to solve the above problem, some of which use insulating structures of the SOI (Silicon On Insulator) type.

Manufacturing SOI structures using the technique of wafer bonding or silicon direct bonding (SDB) is described, for example, in "Silicon-on-Insulator Wafer Bonding-Wafer Thinning Technological Evaluations", by J. Hausman, G. A. Spierings, U. K. P. Biermnan and J. A. Pals, *Japanese Journal of Applied Physics,* Vol. 28, No. 8, August 1989, pp. 1426–1443 and in "Dielectric Isolation Technologies and Power Integrated Circuits", Y. Sugawara, in *Smart Power ICs—Technologies and Applications,* by B. Murari, F. Bertotti, G. A. Vignola, Springer, 1995, pp. 150–157. Specifically, according to this technique, the surface of two silicon wafers is oxidized, and the two wafers are bonded together, to obtain a single wafer comprising a buried oxide layer. A surface of the thus obtained wafer is then ground to reduce the thickness thereof to a desired value (typically from a few tenths to a few tens of microns) and obtain a silicon layer for accommodating the circuit components. The silicon layer and, subsequently, the oxide layer are then selectively etched where power devices are to be formed. Epitaxial growth is then carried out, to obtain islands of buried oxide separated from each other by silicon continuity regions. Finally, the active areas (the regions over the buried oxide islands), are insulated by trenches filled with dielectric material and are used for the forming of low-voltage circuitry while power devices with vertical current flow are formed in the continuity regions of the silicon.

In a variant of the illustrated solution, the oxide islands are formed on one of the wafers prior to bonding.

The illustrated solutions are disadvantageous because of their complexity and the cost associated in particular with some phases, such as wafer bonding to form an SOI substrate. Furthermore, the variant above described has the drawback that bonding of wafers whose surfaces are not uniform (because of the presence of silicon regions and oxide regions) is a difficult process and has low yield.

To overcome these disadvantages, European patent application No. 98830007.5 of Jan. 13, 1998 filed in the applicant's name describes a method using conventional steps in microelectronics. Specifically, according to this method, initially a silicon wafer is recessed to form trenches having a first depth; the silicon portions adjacent to the trenches are protected with a hard mask shaped like an upturned U and the trenches are etched to a second depth. Columns or walls whose top end is protected by the hard mask formn in this way. The wafer is then oxidized and the portions of the columns or walls not protected by the hard mask form silicon oxide regions expanding towards the inside the trenches, closing them. In contrast, the top end of the columns or walls is not oxidized. Therefore, at the end of the oxidation a continuous silicon oxide layer, surmounted by single-crystal silicon regions, is obtained. Finally, using the silicon of the single-crystal silicon regions as nucleus, an epitaxial growth is carried out, forming a layer which can be used for integrating electronic components.

According to a different solution, described in European patent application No. 98830299.8 of May 15, 1998 in the same applicant's name, wells, of $N^+$ type for example, are formed in a substrate, of P type for example, by ion implantation; an epitaxial layer is then grown. Trenches extending as far as the buried wells, laterally thereto, are formed in the epitaxial layer; the buried wells are anodized, then oxidized and then removed, to create a buried air gap having above epitaxial regions of single-crystal silicon connected to each other and to the rest of the wafer by means of silicon columns. Thermal oxidation is then carried out, to grow an oxide region from the walls of the buried air gap and from the trenches, to fill the buried air gap and the trenches. At the end the epitaxial regions are completely surrounded by silicon oxide, both at the sides and at the bottom.

Finally, in European patent application No. 98830476.2 of Aug. 3, 1998 in the same applicant's name, the trenches are formed by two etching steps, firstly anisotropic and then isotropic, to widen the trenches and to reduce the thickness of the portions of the substrate to be oxidized to form the buried oxide region, before carrying out the epitaxial growth.

A drawback of the last three described solutions is that the oxide regions growing by virtue of thermal oxidation exert a pressure on the surrounding single-crystal silicon regions because of the different thermal expansion coefficients. Crystallographic defects may therefore form in the silicon; it is not possible to eliminate these subsequently and they compromise the quality of the end product.

SUMMARY OF THE INVENTION

The present invention provides a process for manufacturing an SOI substrate not affected by the described drawbacks and, in particular, of modest manufacture cost and high quality.

An embodiment of the present invention thus provides a method for manufacturing a wafer comprising first and second single-crystal regions insulated by insulating regions by carrying out a directional etching in a semiconductor material body to form trenches having a first width; carrying an isotropic etching through the trenches of the semiconductor material body under the trenches to form cavities having a second width larger than the first width; covering the walls of the cavities with dielectric material; and depositing non-conducting or poorly conducting material different from thermal oxide to at least partially fill the cavities so as to form a single-crystal island separated from the semiconductor material body.

DETAILED DESCRIPTION OF THE INVENTION

For better understanding of the present invention several embodiments will now be described, purely by way of non-exhaustive example and with reference to the accompanying drawings, wherein.

DETAILED DESCRIPTION OF THE INVENTION

Figure 1:
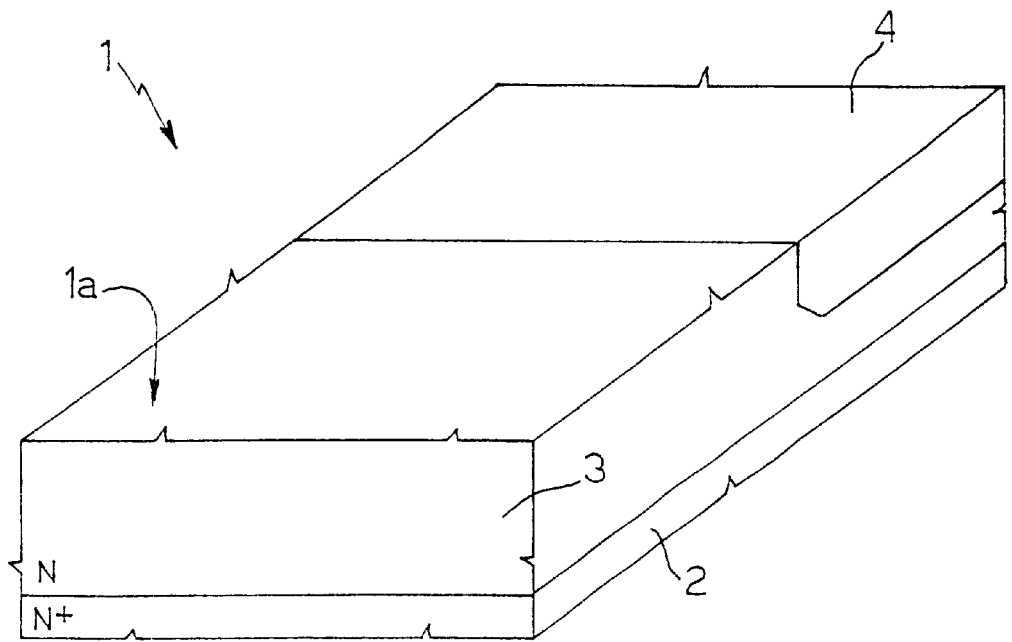
FIG. 1 is a perspective view of a portion of a semiconductor material wafer in an initial manufacture step, according to a first embodiment of the present process.

FIG. 1 shows a wafer 1 of single-crystal silicon comprising a substrate 2, of $N^+$-type for example, doped with antimony or arsenic, and an epitaxial layer 3, of N-type for example, doped with phosphorus. The epitaxial layer 3 may optionally be formed with a double epitaxial layer, with different thicknesses and concentrations or, in general, as a multiple layer. Thickness, concentration and number of layers are dictated by the voltage value required for the end device, according to rules familiar to designers of discrete power devices.

Thick oxide regions, formed, for example, through the known technique LOCOS, are present in the epitaxial layer 3. In particular, FIG. 1 shows a region of thick oxide 4; a similar region, not shown, may be provided in the portion of wafer 1 that is not shown, in symmetrical manner.

Figure 2:
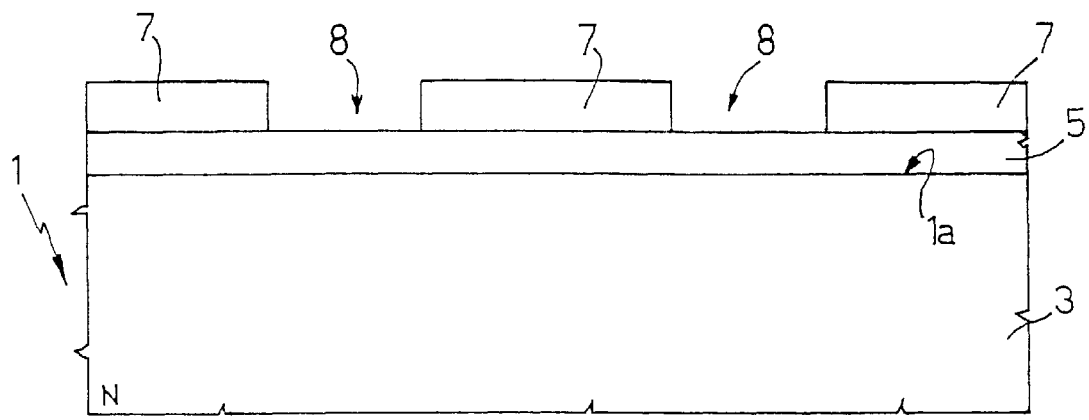
FIGS. 2–7 show cross-sections of the portion of wafer of FIG. 1, in subsequent manufacture steps.

According to FIG. 2, a surface 1a of wafer 1 is subjected to an oxidation process, to form a masking oxide layer 5 of a thickness of 0.5 μm for example. A trench mask 7 is then formed, covering the entire masking oxide layer 5 apart from windows 8 where trenches are to be formed. In the described embodiment, the windows 8 extend parallel to each other in a perpendicular direction to the page, between the thick oxide regions 4 (not shown).

Figure 3:
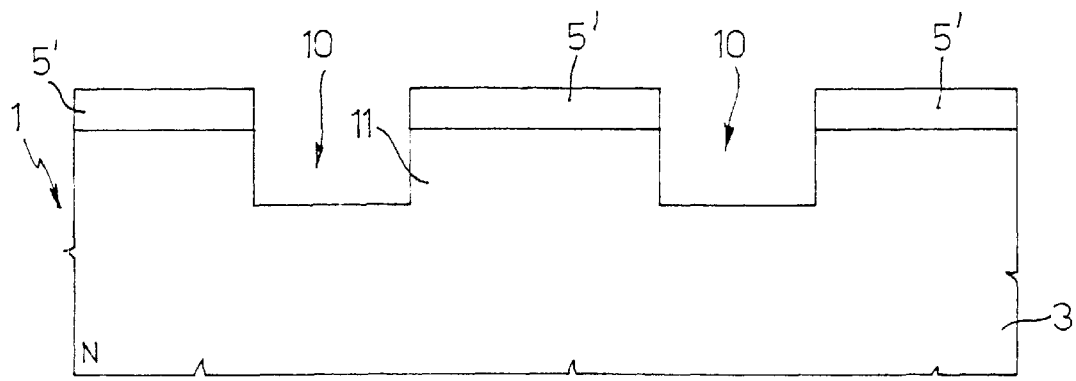

Then, FIG. 3, the exposed portions of the masking oxide layer 5 are selectively removed by oxide etching, forming masking oxide regions 5'; trench mask 7 is then removed; then epitaxial layer 3 is anisotropically etched (silicon trench etching) to obtain trenches 10 of predetermined depth, separated from each other by intermediate silicon regions 11 surmounted by oxide portions 5'. Preferably the trench etching is a dry etching, carried out in plasma.

Figure 4:
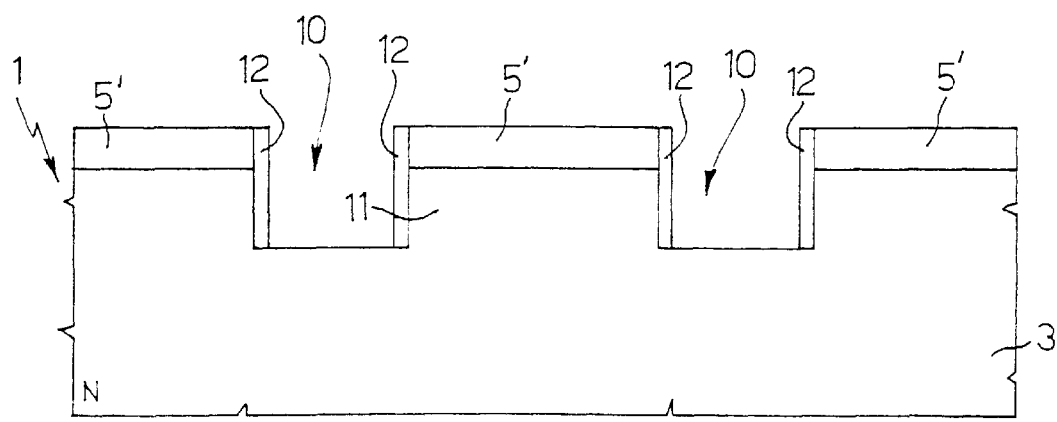

A protective layer is then deposited, of oxide or oxide and nitride for example (with a thickness comprised between 200 and 600 Å respectively, 700 and 1500 Å), and the protective layer is directionally etched without mask, as shown in FIG. 4. Given the etching anisotropy, the horizontal portions of the protective layer on the bottom of the trenches 10 and on top of the oxide portions 5' are removed, obtaining in practice protective regions 12 on the walls of the trenches 10.

Figure 5:
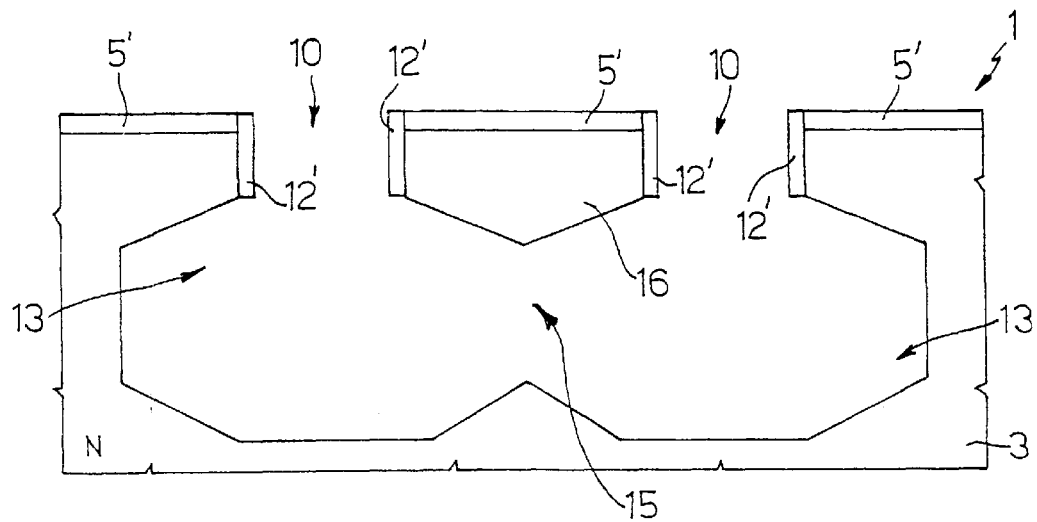

Then, in FIG. 5, silicon is isotropically etched in plasma, for example, in the same machine used for trench etching, modifying the conditions, or in acid solution, to form cavities 13 under the trenches 10. During this step, the silicon underneath the intermediate portions 11 is completely removed and the cavities 13, joining, form a single buried air gap 15. The intermediate portions 11 now extend longitudinally, suspended between pairs of thick oxide 4 regions (one of which is visible in FIG. 1) which act as support, over the buried air gap 15.

Figure 6:
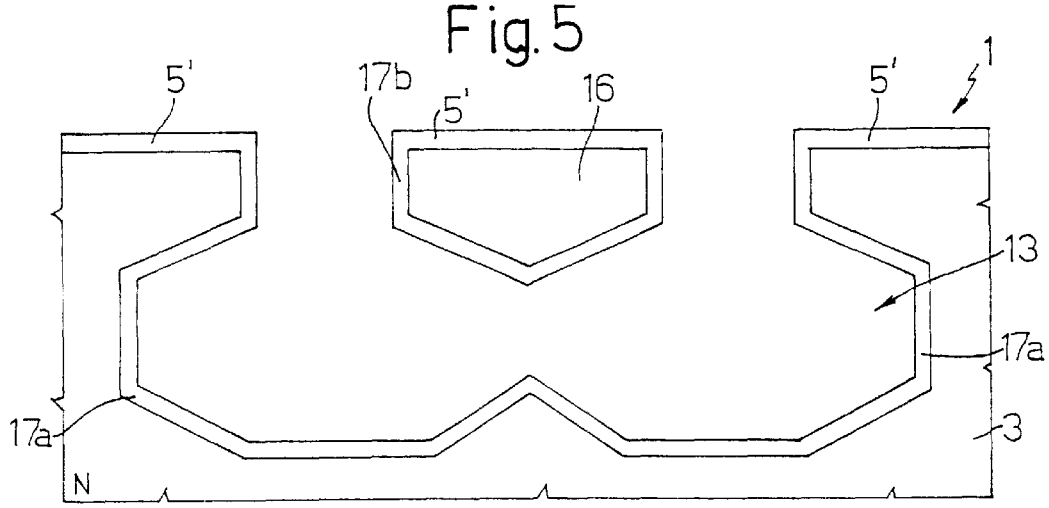

Then, FIG. 6, the wafer 1 is thermally oxidized to grow an interface layer 17a, 17b of silicon oxide, covering the walls of the buried air gap 15 and of the trenches 10 respectively. The thickness of the interface layer 17a, 17b is small (equal to 200 Å for example) to prevent thermal and mechanical stresses caused by oxidation from causing crystallographic defects in the silicon of the epitaxial layer 3 or of the intermediate portions 11. Alternatively, the walls of the buried air gap 15 and of the trenches 10 may also be coated with one or more layers of dielectric material, such as deposited oxide, nitride etc.

Figure 7:
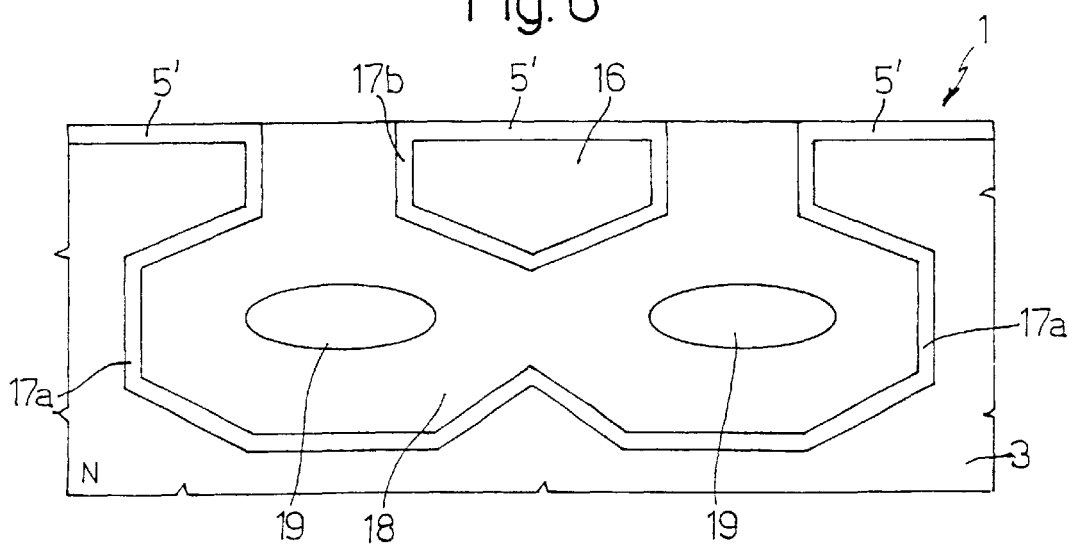

The buried air gap 15 and the trenches 10 are then filled with insulating or poorly conducting material that may be deposited in a conforming or non-conforming way, as shown in FIG. 7. Preferably, undoped multi-crystal or amorphous silicon is deposited. In this way an insulating structure 18 is formed which, together with the interface layer 17a, 17b, surrounds and insulates the intermediate portions 11 (called islands 16 below) from the epitaxial layer 3. In this step the buried air gap 15 may be totally or partially filled. In FIG. 7, for example, gas pockets 19, containing gas at low pressure (such as silane or another gas present in the machine for depositing the material filling the buried air gap 15 and the trenches 10) are present inside the insulating structure 18. The gas pockets 19 do not prejudice the insulation but rather reduce the coupling capacity between the islands 16 and the epitaxial layer 3, since air is a dielectric material.

Figure 8:
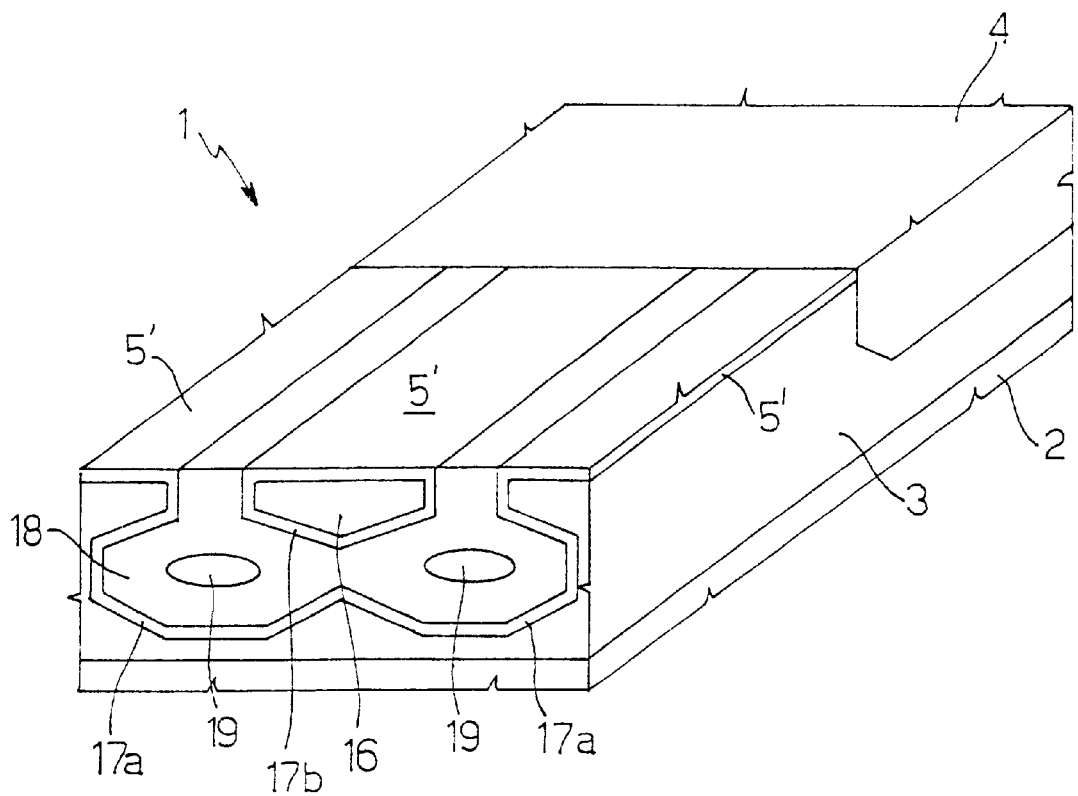
FIG. 8 is a perspective view of the wafer of FIG. 7.

The wafer 1 is then planarized by a mechanical process or an etching for example, obtaining the structure shown in cross-section in FIG. 7 and in perspective view in FIG. 8; conventional processing steps are then carried out to form low-voltage electronic components inside the island 16, which thus constitutes an active area, and vertical-current-flow electronic power components inside the epitaxial layer 3 and/or the substrate 2.

Figure 9:
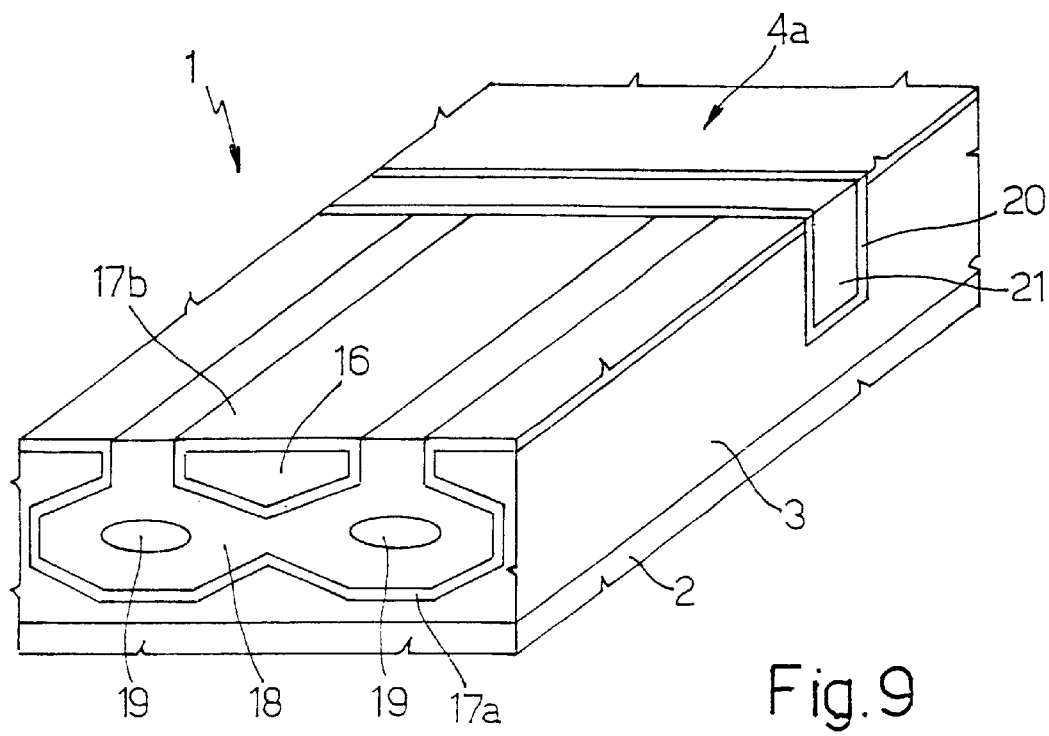
FIG. 9 shows a semiconductor material wafer similar to that of FIG. 8, formed according to a second embodiment of the present process.

According to a different embodiment, shown in FIG. 9, the thick oxide regions 4 are formed with trench insulation regions, one of which is visible in FIG. 9 and is shown at 4a, instead of by local oxidation. Specifically, the trench insulation regions 4a are formed first, after growing the epitaxial layer 3, excavating the epitaxial layer 3 through suitably masked anisotropic etching; coating the walls of the trenches with a thin oxide layer 20; then filling the trenches with multi-crystal or amorphous silicon 21 and then planarizing the structure. The structure of FIG. 9 is then obtained, by carrying out the steps previously described with reference to FIGS. 2–7.

The purpose of the trench insulation regions 4a is to support the intermediate regions 11 after isotropic etching for forming the trenches 10. With respect to the embodiment of FIGS. 1–8, forming trench insulation regions 4a has the advantage of forming deeper islands 16. In fact, the maximum thickness of the thick oxide regions 4 formed through the LOCOS technology is 2 μm and so the regions of thick oxide 4 penetrate into the epitaxial layer 3 by 1 μm at the most, which thus also represents the maximum thickness of the islands 16. This limit does not exist, however, if trench insulation regions 4a are formed; consequently, the islands 16, which must be slightly less thick than the trench insulation regions 4a, may be formed with the desired thickness, as required by the operating voltages provided for the components to be integrated.

Figure 12:
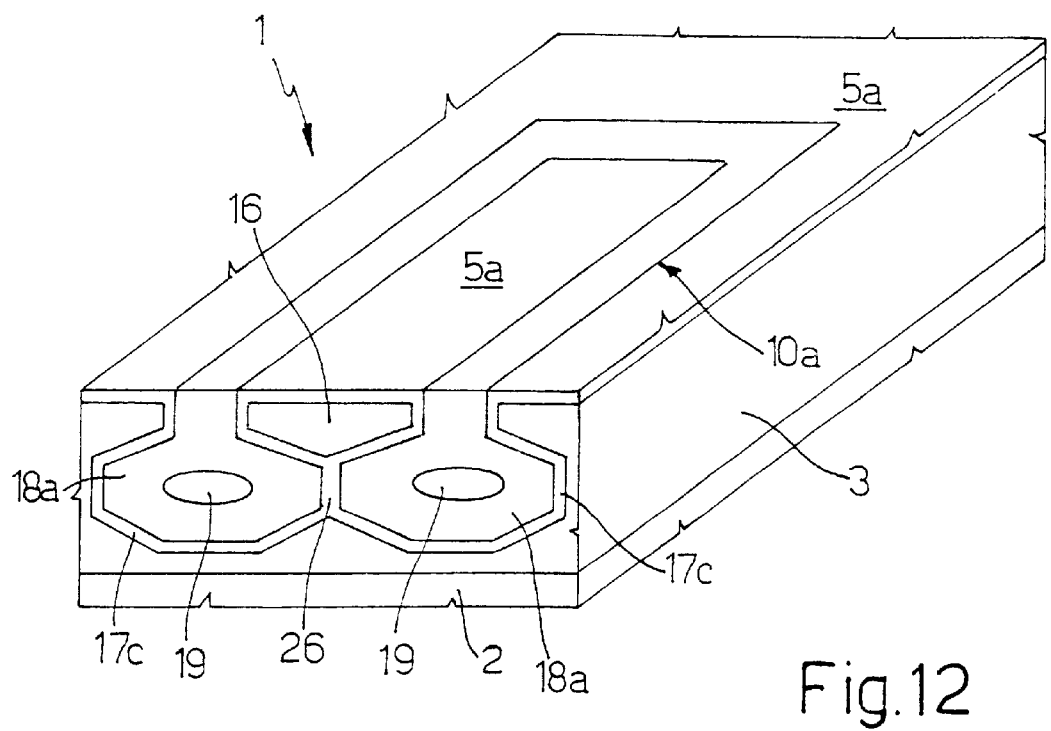
FIG. 12 is a perspective view of the wafer of FIG. 11, in a subsequent manufacture step.
Figure 10:
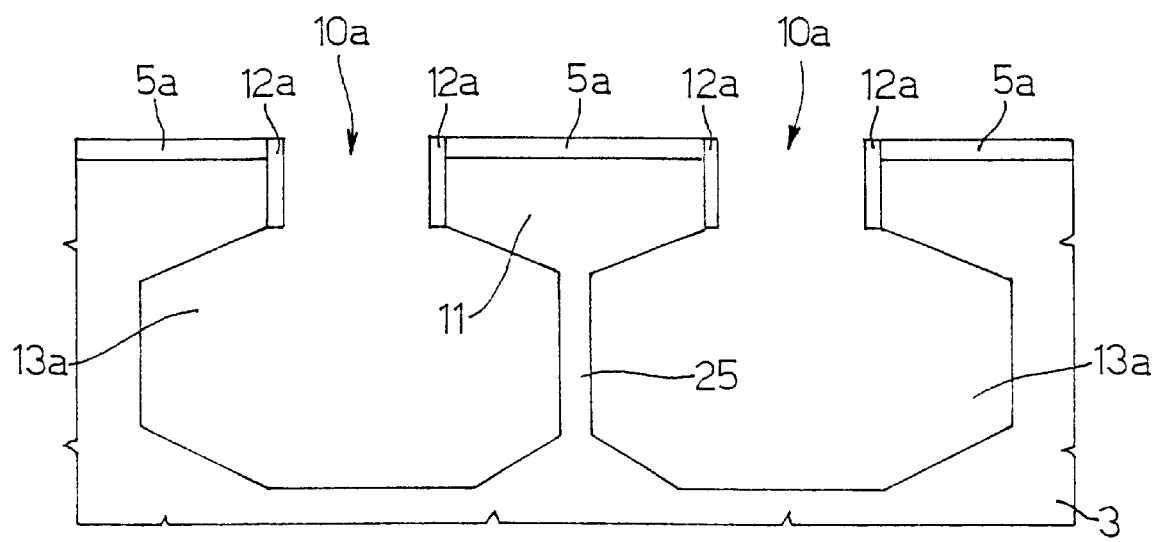
FIGS. 10 and 11 show cross-sections similar to those of FIGS. 2–7, in subsequent manufacture steps according to a third embodiment of the invention.
Figure 11:
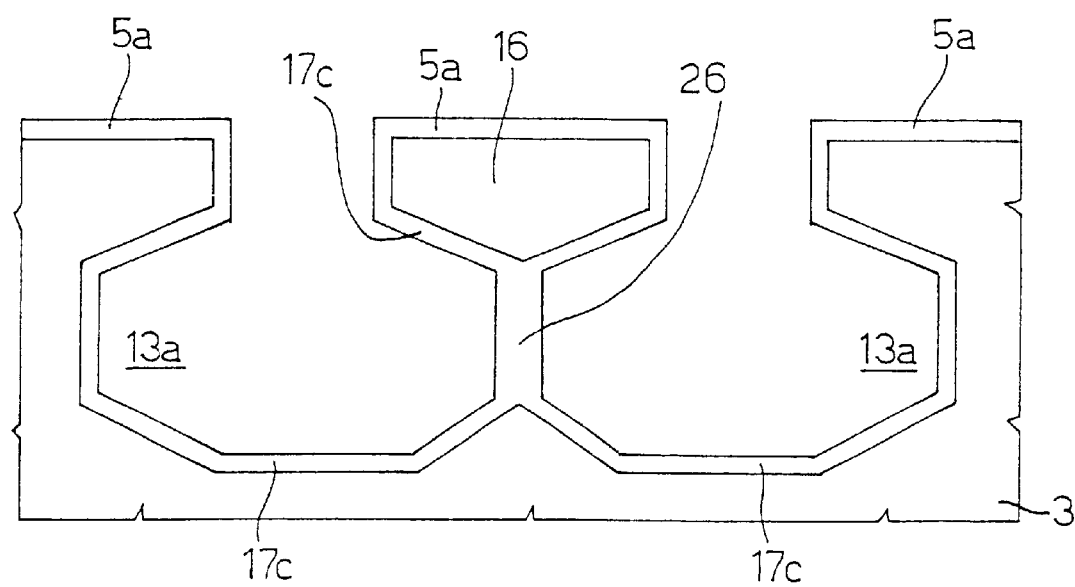

FIGS. 10–12 show a third embodiment wherein the support for the intermediate portions 11 is provided from below by the epitaxial layer 3 or the substrate 2, not removed completely during anisotropic etching. Specifically, according to the third embodiment, the initial steps described with reference to FIGS. 1–4 up to forming protective regions 12a are initially carried out, except the thick oxide layer 4 or 4a is not grown. Furthermore, the form of the trenches, here shown at 10a, is different from that of FIGS. 1–9; in particular, the trenches 10a are connected in couples, at respective ends, to form trenches of closed form, rectangular for example (see FIG. 12 in particular, showing a trench 10a after filling with the insulating structure).

According to the third embodiment, shown in FIG. 10, after the protective regions 12a have been formed, silicon is isotropically etched, similarly to FIG. 5; in this case. however, etching ceases before all the silicon under the intermediate portions 11 is removed, so that the cavities 13a formed on the two long sides of each trench 10a do not join but are separated by a thin wall or column 25 (FIG. 10). Conveniently the thickness of the thin wall 25 is comprised between 100 and 500 nm.

Then, FIG. 11, the wafer is subjected to thermal oxidation to grow the silicon oxide interface layer, shown here at 17c and covering the walls of the cavities 13a and the trenches 10a, as shown in FIG. 11. During this step the thin wall 25 is completely oxidized, forming an oxide column 26; consequently, the intermediate portion 11 is electrically insulated from the epitaxial layer 3, forming the island 16. Also here, the interface layer 17c is of reduced thickness (equal to at least 50 nm for example).

Finally, the cavities 13a and the trenches 10a are filled with multi-crystal or amorphous silicon, as already described with reference to FIG. 7, to form insulating structures 18a, optionally having gas pockets or bubbles 19 (FIG. 12).

Figure 13:
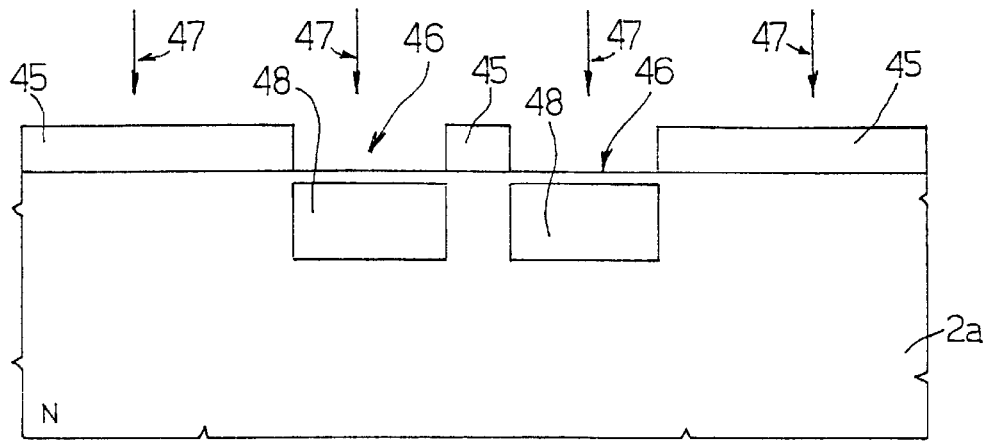
FIGS. 13–16 show cross-sections similar to those of FIGS. 2–7, in subsequent manufacture steps according to a fourth embodiment of the invention.

FIGS. 13–16 show a fourth embodiment of the process according to which a damage implant is first carried out, starting from a substrate 2a of N-type. To this end, a first mask 45 is formed, covering the entire surface of the substrate 2a apart from openings 46 (FIG. 13). An implant of an ion, a dopant for example (such as boron, phosphorus, antimony or arsenic), shown diagrammatically by arrows 47, is then carried out so as to create damaged regions 48.

Figure 14:
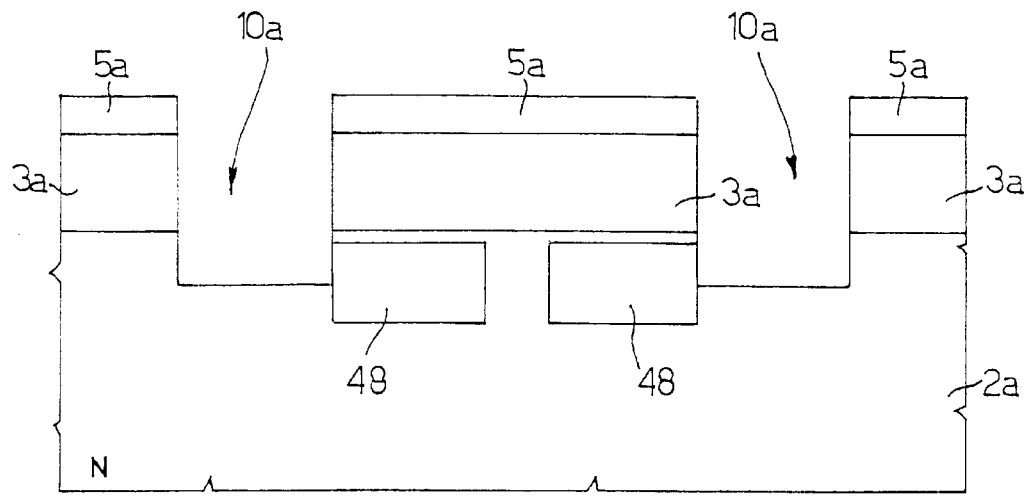

The first mask 45 is then removed; the substrate 2a is optionally subjected to a thermal implanted ion diffusion or activation step and an epitaxial layer 3a is grown, as shown in FIG. 14.

Silicon trench etching is then carried out, as already described with reference to FIGS. 2 and 3. In particular, masking oxide regions 5a are formed and trench etching is carried out, to form trenches 10a, having a depth such as to reach the damaged regions 48. The structure of FIG. 14 is obtained in this way.

Figure 15:
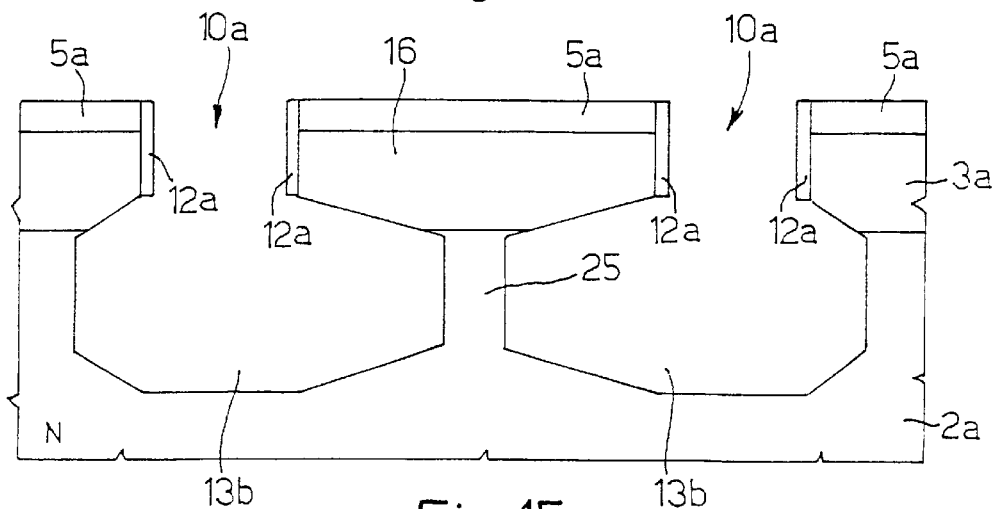
Figure 16:
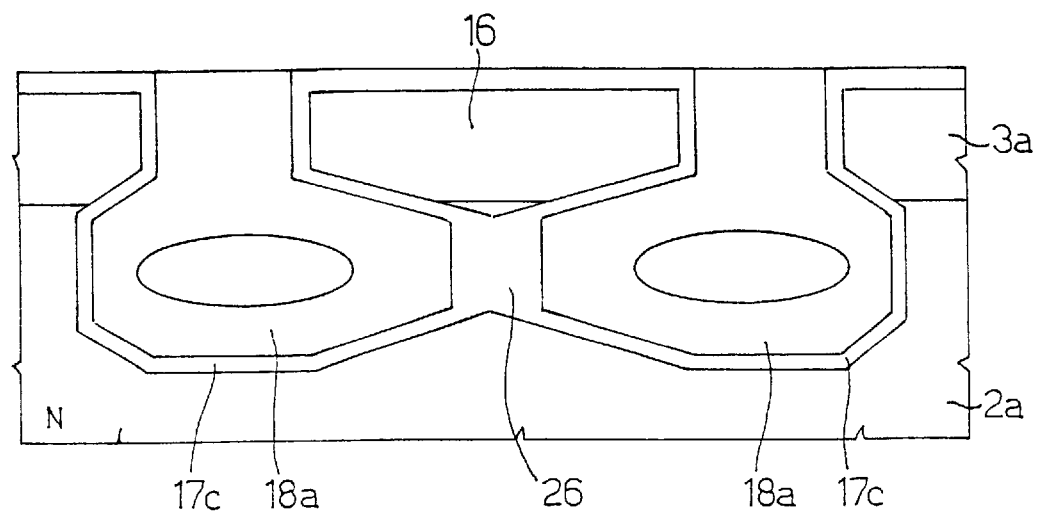

After the protective regions 12a have been formed, silicon is isotropically etched, in acid environment for example, FIG. 15. In certain conditions the doping material renders etching more selective, allowing a more rapid removal of the silicon from the damaged regions 48 than elsewhere; consequently, during this step asymmetrical cavities 13b are formed, mutually separated by thin walls or columns 25.

Steps similar to those described with reference to FIG. 11 are then carried out. In particular, thermal oxidation is carried out; thus the interface oxide layer 17c is formed and the thin wall 25 is completely transformed into silicon oxide (region 26). The cavities 13b and the trenches 10a are then filled with multi-crystal or amorphous silicon, forming the insulating structure 18a of FIG. 16, which electrically separates the island 16 from the rest of the epitaxial layer 3a and the substrate 2a.

In this way it is possible to shape the cavities 13b in different ways and, consequently, modify the shape of the insulating structure 18a and the active area defined by the island 16 as desired. In particular, if desired, it is possible to give the island 16 a flatter shape and prevent the buried air gap 15 from widening too much towards the outside with respect to the useful zone. Furthermore it is possible to control the thickness of the thin wall 26 in a more effective manner than with a simple isotropic etching of the silicon.

According to a different embodiment of the process just described with reference to FIGS. 13–16, inert substances (such as silicon, argon or nitrogen) may be used instead of dopants to form the damaged regions 48. The crystallographic damage caused by the ion implant accelerates the etching speed. In this case it is not necessary to interpose thermal processes between the implant of the damaged regions 48 and the growth of the epitaxial layer 3a.

Alternatively, hydrogen or helium at high dose is implanted; micro-cavities are formed in the damaged region 48 in this way. In fact, during implantation, gas forms gaseous bubbles in the silicon, and, in a subsequent thermal process, the bubbles join, increasing in size and reducing in number. The subsequent epitaxial growth to form the epitaxial layer 3a may be carried out without damaging the micro-cavities; in this way silicon isotropic etching takes place more quickly where the micro-cavities are present, forming cavities of suitable shape at the damaged regions 48.

Finally it is also possible to proceed as described above, implanting hydrogen or helium and carrying out epitaxial growth and trench etching. An oxidation step is then carried out, thereby an oxide layer grows both on the walls of the trenches and in the damaged regions 48 where the micro-cavities are present. At the end, the damaged regions 48 are formed by silicon oxide. Oxide is then etched with hydrofluoric acid. In this way a horizontal trench is formed. The trench may be deepened by isotropically etching silicon or filled immediately with multi-crystal or amorphous silicon.

The process described has the following advantages. Primarily it is simple, of low manufacture cost and high yield, since the used individual steps are per se known and common in microelectronics, and it is not necessary to bond two silicon wafers. Furthermore, forming insulating structures according to the described process requires at the most only thermal growth of thin oxide layers to cover the walls of the trenches and the buried air gap and formation of the interface layer 17 between the single-crystal silicon of the epitaxial layer 3 or the substrate 2 and the multi-crystal or amorphous silicon of the insulating structure 18; consequently, the probability is reduced of thermal and mechanical stresses associated with the oxidation process forming crystallographic defects in the silicon and large regions with a different coefficient of expansion subjecting the structure to stress during operation.

Forming support regions for the island 16 through end oxide regions 4, 4a or, preferably, columns 25, 26 permits the suspension of the island 16 (or intermediate portion 11) in a very simple and effective manner, without requiring specific manufacture steps and with high reliability and reproducibility.

Furthermore, the present process reduces the silicon area required for integrating power devices and high-speed low-voltage devices (such as components of the control circuitry of the power devices), which may be formed inside the island 16 and thus inside the power devices.

Figure 17:
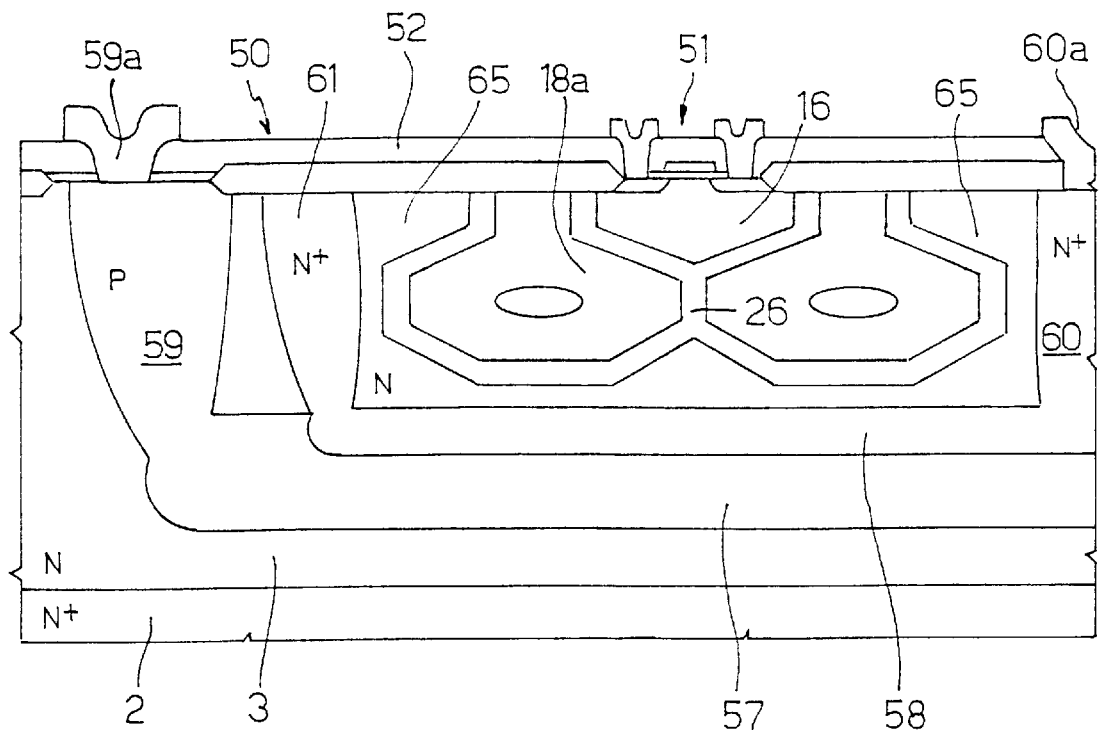
FIG. 17 shows a cross-section of an integrated power circuit provided with an insulating structure formed according to the present process.

An example of integration of a power device and a low-voltage high-speed device is shown, for example, in FIG. 17, relating to a bipolar power transistor 50, with vertical current flow and interdigited structure, and a PMOS transistor 51. In particular, FIG. 17 shows a first half of a finger 52 of the bipolar power transistor 50, a second half of the finger 52 being symmetrical. In detail, the bipolar power transistor 50 comprises a substrate 2, of $N^+$-type, forming the collector of the device; an epitaxial layer 3; a buried base region 57, of P-type, and a buried emitter region 58, of $N^+$-type, formed above the buried base region 57 and adjacent thereto. Furthermore, FIG. 17 shows a base diffusion contact region 59, of P-type; a base contact metal region 59a; an emitter diffusion contact region 60; an emitter contact metal region 60a; and a sinker region 61. The emitter diffusion contact region 60 and the sinker region 61 are both $N^+$-type and are formed at the same time.

An insulating structure 18a and an island 16, formed according to one of the embodiments of the present process, are present in a portion 65 of the epitaxial layer 3 included between the emitter diffusion contact region 60 and the sinker region 61, above the buried emitter region 58. Inside the island 16, defining an active area, is the PMOS transistor 51 of known structure and not therefore described in detail. Consequently, since the PMOS transistor 51 of the circuitry is disposed over the buried emitter region 58, the overall area of silicon is equal to the area occupied by the bipolar power transistor 50 alone.

The embodiment of FIG. 17 also has the advantage that the PMOS transistor 51 (or another component) formed in the island 16 is dielectrically insulated from the remaining wafer since there can be no current flow between the island 16 and the rest of the epitaxial layer 3 or the substrate 2; furthermore, it is also capacitively isolated from the substrate, in that currents induced by sudden voltage fluctuations on the substrate may not reach the components of the island 16 since they are connected to ground by the low-resistivity path constituted by the emitter (region 58). Finally, even electromagnetic interference does not reach the component integrated in the island 16 in that it is surrounded by a kind of Faraday cage, formed by the emitter (regions 58, 60, 61).

Finally, it will be evident that modifications and variants may be introduced to the described process and the wafer without departing from the scope of the present invention, as defined in the accompanying claims. In particular, to improve the properties of the insulating structure, the interface layer may be formed by several dielectric layers; for example, besides an oxide layer (grown thermally or deposited), a silicon nitride layer 4 may be provided.

Furthermore, the cavities may be filled with different materials. In particular, instead of multi-crystal or amorphous silicon, another insulating or poorly conducting material may be used (such as deposited oxide, TEOS—tetraethylorthosilicate or polyamide) which may be deposited in a conforming or non-conforming manner, without subjecting the silicon wafer to thermal stress.

The single-crystal region may comprise the substrate alone or several epitaxial layers grown successively with different thicknesses and conductivities, as indicated. Furthermore, the wafer thus obtained may be used for a multiplicity of applications, such as to form integrated microsensors.

Finally, the control circuit of the power transistor may be formed in a different region of the wafer while the active area formed by the island may be used for circuitry having different functions.

What is claimed is:

1. A process for manufacturing a wafer of semiconductor material, comprising:
    carrying out a directional etching in a semiconductor material body to form trenches having a first width;
    carrying out an isotropic etching of said trenches of said semiconductor material body under said trenches to form cavities having a second width larger than the first width;
    covering said walls of said cavities with dielectric material;
    depositing insulating material to at least partially fill said cavities so as to form a single-crystal island separated from said semiconductor material body.

2. The process of claim 1 wherein carrying out a directional etching comprises carrying out a plasma etching.

3. The process of claim 1 wherein carrying out an isotropic etching comprises carrying out a plasma etching or an acid solution etching.

4. The process of claim 1 wherein forming cavities comprises forming at least two adjacent cavities separated by a support region of semiconductor material, and wherein covering said walls comprises oxidizing said walls and said support region.

5. The process of claim 4 wherein said trenches are connected in couples and form a closed line.

6. The process of claim 1, comprising, prior to said directional etching, forming support regions of insulating material, extending transversely and adjacent to ends of said trenches.

7. The process of claim 6 wherein said support regions comprise thick oxide regions.

8. The process of claim 6 wherein said support structures comprise trenches filled with dielectric material.

9. The process of claim 4, further comprising, prior to said directional etching, carrying out a damage implant to form at least two damaged regions in adjacent and non-adjacent position and growing an epitaxial layer, and wherein carrying out an isotropic etching comprises removing said damaged regions.

10. The process of claim 9 wherein carrying out a damage implant comprises implanting a doping agent.

11. The process of claim 10 wherein said doping agent is selected from among boron, phosphorus, antimony and arsenic.

12. The process of claim 9 wherein carrying out a damage implant comprises implanting an inert material and generating crystallographic damage.

13. The process of claim 12 wherein said inert material is selected from among silicon, argon and nitrogen.

14. The process of claim 9 wherein carrying out a damage implant comprises implanting a gaseous material forming bubbles.

15. The process of claim 14 wherein said gaseous material is selected from among hydrogen and helium.

16. The process of claim 13, further comprising, after carrying out a directional etching, oxidizing said damaged regions, and further wherein carrying out an isotropic etching comprises etching said semiconductor material body and said damaged regions with hydrofluoric acid.

17. The process of claim 1 wherein said insulating material is selected from the group comprising: undoped multicrystal silicon, undoped amorphous silicon, and deposited silicon oxide.

18. A wafer of semiconductor material, comprising a semiconductor material body surrounding an insulating structure of non-conducting material, an island surrounded by said insulating structure and a support structure for said island, arranged laterally to or under said island, between said island and said semiconductor material body.

19. The wafer of claim 18 wherein said support structure is formed by at least one vertical support column of silicon oxide extending between said semiconductor material body and said island through the insulating structure.

20. The wafer of claim 18 wherein said support structure comprises at least one end support region of dielectric material extending between said body of semiconductor material and said island transversely and adjacent to said island.

21. The wafer of claim 20 wherein said end support region comprises a thick field oxide.

22. The wafer of claim 20 wherein said end support region is formed from a trench filled with dielectric material.

23. An integrated power device, comprising a semiconductor material body surrounding an insulating structure of non-conducting material, and an island surrounded by said insulating structure; said semiconductor material body housing a vertical-current-flow power transistor including a buried conduction region and said island housing a low-voltage device, said buried conduction region arranged under said island and said insulating structure.

24. The device of claim 23, comprising a vertical support column of silicon oxide extending inside said insulating structure between a lower portion of said semiconductor material body and said island.

25. A process for manufacturing integrated circuits, comprising:

forming in a semiconductor material body a single-crystal island separated from the semiconductor material body with non-conductive material other than thermal oxide.

26. The process of claim 25 wherein forming the single-crystal island comprises etching one or more cavities in the semiconductor material body to isolate the single-crystal island.

27. The process of claim 26 wherein forming the one or more cavities comprises:

directionally etching the semiconductor material body to form one or more trenches; and isotropically etching through the trenches the semiconductor material body to form cavities under the trenches, the cavities having a width greater than the width of the trenches.

28. The process of claim 27, further comprising covering the walls of the one or more cavities with a dielectric material.

29. The process of claim 27 wherein forming one or more cavities comprises forming at least two adjacent cavities separated by a wall that supports the single-crystal island in the semiconductor material body.

30. The process of claim 25 wherein forming the single-crystal island further comprises forming at least one end support region of dielectric material extending between the semiconductor material body and the single-crystal island transversely and adjacent to the single crystal island.

* * * * *